United States Patent
Fu et al.

(10) Patent No.: US 9,371,955 B2
(45) Date of Patent: Jun. 21, 2016

(54) BI-DIRECTIONAL TILT MECHANISMS AND METHODS

(71) Applicant: Ergotron, Inc., St. Paul, MN (US)

(72) Inventors: Xiao long Fu, Dongguan (CN); Shaun C. Lindblad, Lino Lakes, MN (US)

(73) Assignee: Ergotron, Inc., St. Paul, MN (US)

( * ) Notice: Subject to any disclaimer, the term of this patent is extended or adjusted under 35 U.S.C. 154(b) by 0 days.

(21) Appl. No.: 14/504,619

(22) Filed: Oct. 2, 2014

(65) Prior Publication Data

US 2015/0097092 A1 Apr. 9, 2015

Related U.S. Application Data

(60) Provisional application No. 61/887,725, filed on Oct. 7, 2013.

(51) Int. Cl.

| F16M 11/10 | (2006.01) |
|---|---|
| A47B 97/00 | (2006.01) |
| H05K 5/02 | (2006.01) |
| F16M 11/04 | (2006.01) |
| F16M 13/02 | (2006.01) |
| E05D 11/06 | (2006.01) |

(52) U.S. Cl.
CPC ............... *F16M 11/10* (2013.01); *A47B 97/00* (2013.01); *E05D 11/06* (2013.01); *F16M 11/04* (2013.01); *F16M 11/105* (2013.01); *F16M 13/02* (2013.01); *H05K 5/0204* (2013.01); *A47B 2097/005* (2013.01); *F16M 2200/041* (2013.01)

(58) Field of Classification Search
CPC ..... F16M 11/04; F16M 11/10; F16M 11/105; F16M 13/02; F16M 2200/041; E05D 11/06
See application file for complete search history.

(56) References Cited

U.S. PATENT DOCUMENTS

| 6,220,586 B1 * | 4/2001 | Pavlin | B21F 35/003 267/155 |
|---|---|---|---|
| 6,367,756 B1 * | 4/2002 | Wang | F16M 11/04 248/276.1 |
| 6,899,311 B1 * | 5/2005 | Ternus | F16M 11/10 248/454 |
| 7,401,717 B2 * | 7/2008 | Chen | B60N 2/305 180/219 |
| 7,593,218 B2 * | 9/2009 | Hwang | F16M 11/04 248/917 |

(Continued)

FOREIGN PATENT DOCUMENTS

| EP | 1930646 A2 | 6/2008 |
|---|---|---|
| GB | 2186629 A | 8/1987 |
| WO | WO-2015054013 A1 | 4/2015 |

OTHER PUBLICATIONS

"International Application Serial No. PCT/US2014/058742, International Search Report mailed Jan. 9, 2015", 4 pgs.

(Continued)

*Primary Examiner* — Terrell McKinnon
*Assistant Examiner* — Eret McNichols
(74) *Attorney, Agent, or Firm* — Schwegman Lundberg & Woessner, P.A.

(57) ABSTRACT

A tilt mechanism for an electronic display including a torsion spring, the torsion spring providing a spring torque to balance a monitor torque due to weight of the monitor. The tilt mechanism allowing an electronic display to be positioned at a variety of tilt angles within a range of tilt angles. Such a tilt mechanism allowing an electronic display to be positioned at positive and negative tilt angles within the range of tilt angles. Methods of using a tilt mechanism.

17 Claims, 7 Drawing Sheets

(56) References Cited

U.S. PATENT DOCUMENTS

| | | | | |
|---|---|---|---|---|
| 7,967,273 B2* | 6/2011 | Zhou | ................. | F16M 11/04 248/176.3 |
| 8,011,632 B2* | 9/2011 | Wang | ................. | F16M 11/04 248/284.1 |
| 8,070,115 B2* | 12/2011 | Wang | ................. | F16M 11/04 248/133 |
| 8,199,473 B2* | 6/2012 | Zhou | ................. | F16M 11/10 248/917 |
| 9,155,235 B2* | 10/2015 | Lindblad | ............. | H05K 13/0015 |
| 2004/0055114 A1* | 3/2004 | Lu | ................. | E05D 11/087 16/340 |
| 2006/0032998 A1* | 2/2006 | Depay | ................. | F16M 11/10 248/291.1 |
| 2006/0219849 A1* | 10/2006 | Chiu | ................. | F16M 11/04 248/125.8 |
| 2007/0029457 A1* | 2/2007 | Baek | ................. | F16C 11/10 248/372.1 |
| 2007/0262210 A1* | 11/2007 | Oh | ................. | F16M 11/10 248/125.1 |
| 2008/0101853 A1* | 5/2008 | Huang | ................. | F16C 11/02 403/92 |
| 2009/0106935 A1 | 4/2009 | Tsai et al. | | |
| 2010/0096518 A1* | 4/2010 | Wang | ................. | E05D 11/087 248/125.7 |
| 2010/0193653 A1* | 8/2010 | Sweere | ................. | A47B 21/0073 248/297.21 |
| 2011/0062304 A1* | 3/2011 | Hsieh | ................. | F16M 11/00 248/372.1 |
| 2011/0084188 A1 | 4/2011 | Oddsen, Jr. et al. | | |
| 2012/0005860 A1* | 1/2012 | Chen | ................. | H04M 1/0216 16/305 |
| 2012/0019990 A1* | 1/2012 | Segar | ................. | F16M 11/08 361/679.01 |
| 2012/0293937 A1* | 11/2012 | Myerchin | ............ | F16M 11/046 361/679.05 |
| 2013/0009023 A1* | 1/2013 | Chen | ................. | A47B 23/043 248/125.8 |
| 2013/0083458 A1* | 4/2013 | Chien | ................. | F16M 11/10 361/679.01 |
| 2013/0200240 A1* | 8/2013 | Lindblad | ................. | F16M 3/04 248/372.1 |
| 2014/0029231 A1* | 1/2014 | Fu | ................. | F16M 11/10 361/807 |
| 2014/0063750 A1* | 3/2014 | Mau | ................. | G06F 1/1601 361/728 |

OTHER PUBLICATIONS

"International Application Serial No. PCT/US2014/058742, Written Opinion mailed Jan. 9, 2015", 5 pgs.

* cited by examiner

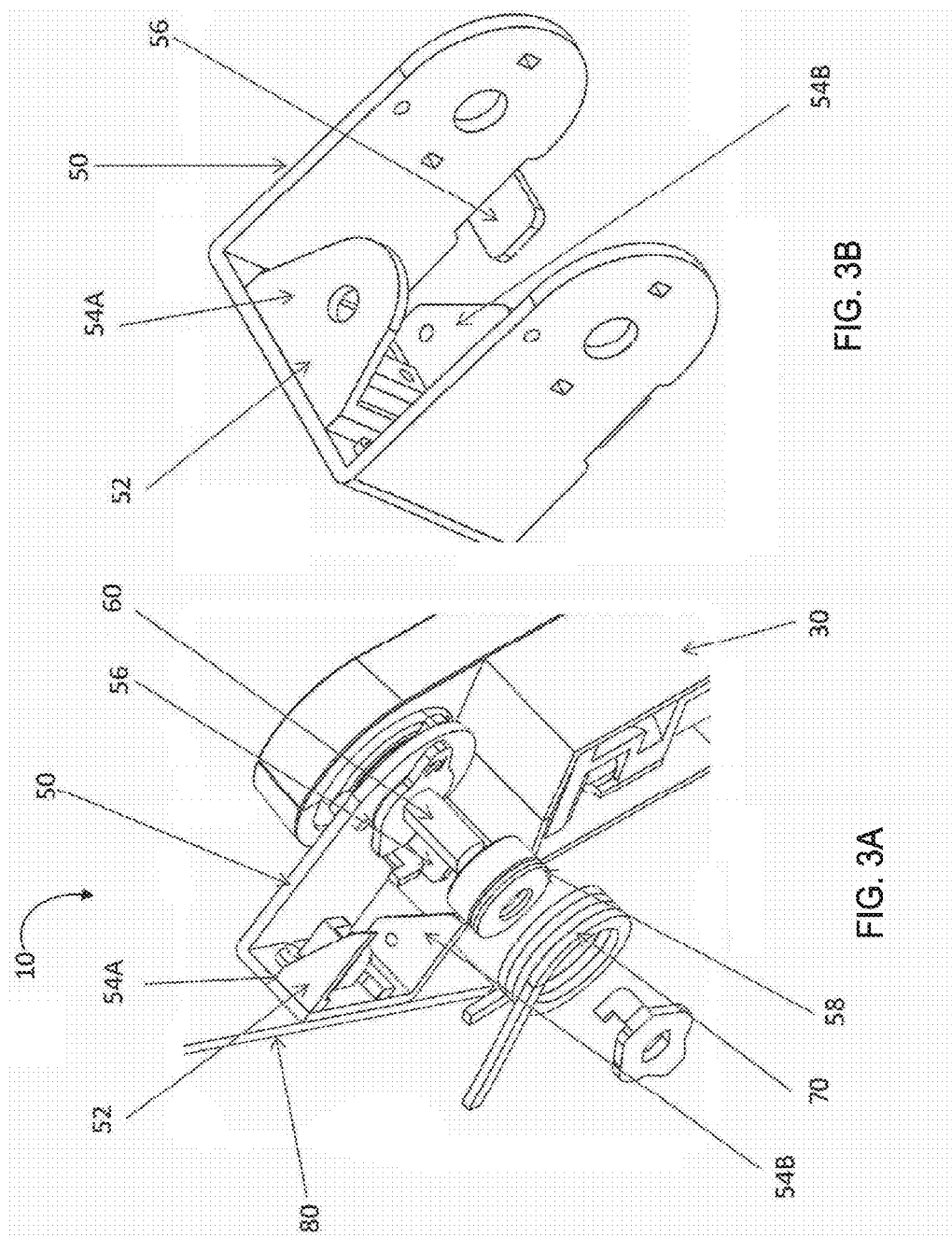

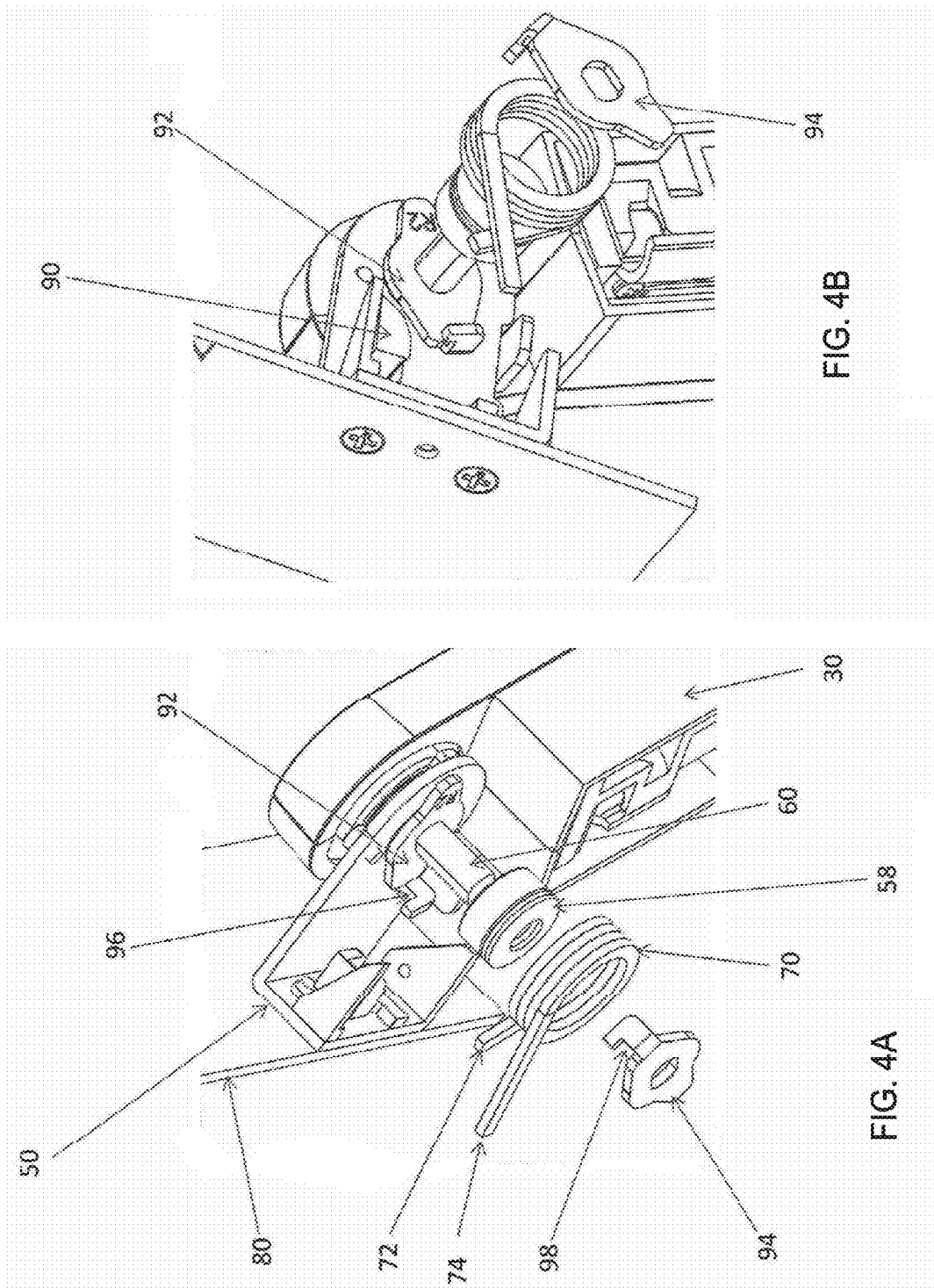

BI-DIRECTIONAL TILT MECHANISMS AND METHODS

This application is related to U.S. Provisional Application No. 61/887,725 titled, "BI-DIRECTIONAL TILT MECHANISMS AND METHODS" to Xiao long Fu et al., and filed on Oct. 7, 2013, the entire content being incorporated herein by reference, and the benefit of priority being claimed herein.

TECHNICAL FIELD

This disclosure generally relates to systems and methods for tilt mechanisms for electronic displays.

BACKGROUND

Tilt mechanisms are used to adjust a tilt angle of an electronic display for ergonomic viewing by a user.

SUMMARY

Embodiments of the invention include a tilt mechanism for an electronic display. In some embodiments, the tilt mechanism is coupled to a mounting structure and includes a tilt bracket tiltable relative to the mounting structure and a torsion spring positioned about a tilt axis. In some embodiments, the torsion spring can provide a spring torque to balance a monitor torque created by an electronic display coupled to the tilt bracket. The direction of the spring torque can change within a range of tilt angles. Embodiments of the invention also include methods of using such tilt mechanisms. Such tilt mechanisms can be carried by stands, arms, carts and the like.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the invention will hereinafter be described in conjunction with the appended drawings, wherein like numerals denote like elements.

FIG. 3A is an exploded perspective view of a tilt mechanism according to an embodiment of the invention.

FIG. 3B is a perspective view of a tilt bracket according to an embodiment of the invention.

FIG. 4A is an exploded perspective view of a tilt mechanism according an embodiment of the invention.

FIG. 4B is an exploded side perspective view of a tilt mechanism according to an embodiment of the invention.

DETAILED DESCRIPTION

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

As shown in FIGS. 1-7, some embodiments include a tilt mechanism 10 for an electronic display 20 (sometimes referred to herein as a "monitor"). The tilt mechanism 10 can be useful for attaching a monitor 20 to a mounting structure 30 (e.g., a stand with a base and a generally vertical riser as shown, an arm, or a cart). Such tilt mechanisms can be useful for adjusting tilt angles of the monitor about a tilt axis of rotation TAR during the use of the display to facilitate ease of viewing, or to stow the display at a lower profile during shipment.

Figure 1A:
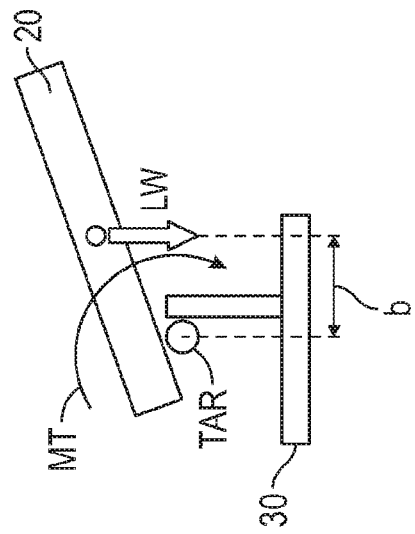
FIGS. 1A-1C are embodiments of an electronic display tilted at three respective subranges of tilt angles within a range of tilt angles.
Figure 1B:
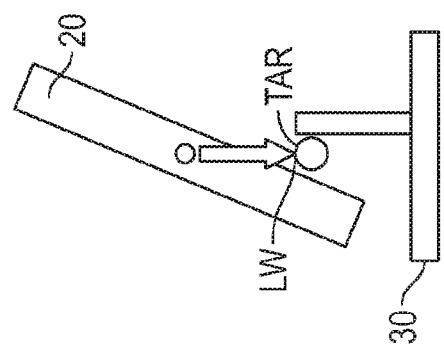
Figure 1C:
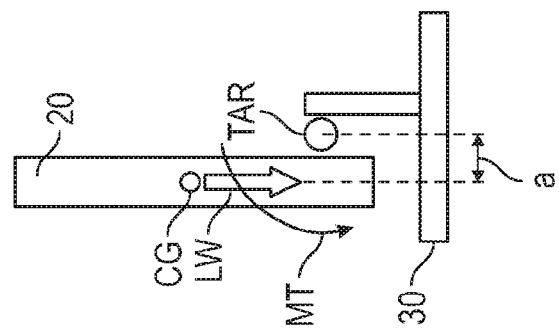

An example embodiment of a monitor 20 mounted on a mounting structure 30 is shown in FIGS. 1A-1C. The line of action of the weight LW of the monitor can be at a distance from the tilt axis TAR. FIG. 1A depicts the line of action weight LW at a first distance "a" from the TAR on a first side of the mounting structure. FIG. 1B shows the line of action weight LW in line with the TAR. FIG. 1C shows the line of action weight LW at a second distance "b" from the TAR, the second distance being on the opposite side of the mounting structure from the first distance "a."

The line of action of the weight LW of the monitor can introduce a monitor torque MT due to the weight of the monitor. FIG. 1A shows the monitor torque MT in a first direction. The monitor torque MT is approximately zero when the line of action of the weight LW of the monitor is in line with the tilt axis TAR, as depicted in FIG. 1B. FIG. 1C shows the monitor torque MT in a second direction opposite to the first direction.

Figure 2A:
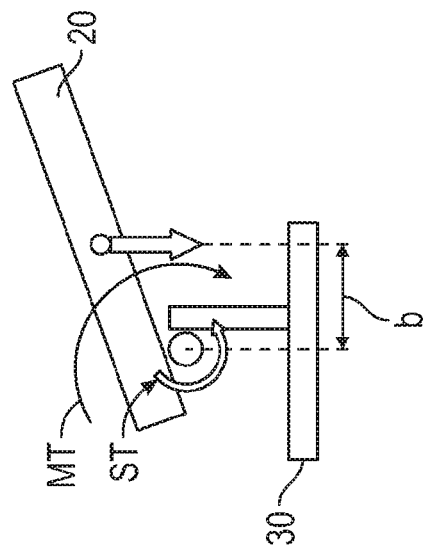
FIGS. 2A-2C are embodiments of an electronic display tilted at three respective subranges of tilt angles within a range of tilt angles.
Figure 2B:
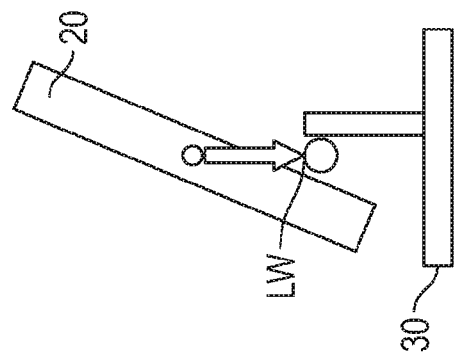
Figure 2C:
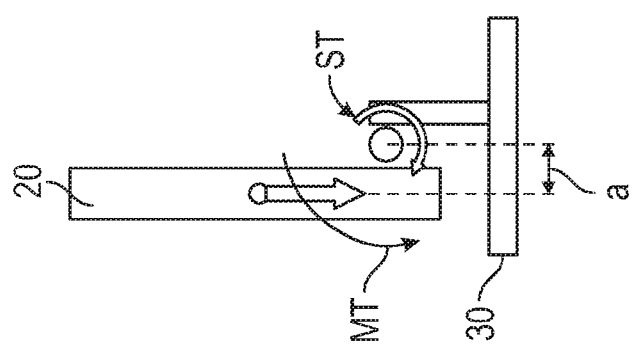

The tilt mechanism 10 can be useful for tilting a monitor 20 across a range of tilt angles. The range of tilt angles can be approximately −90 degrees to approximately 90 degrees. The range of tilt angles can include a first subrange S1, a second subrange S2 and a third subrange S3 of tilt angles. The first subrange S1 of the range of tilt angles can be between approximately 30 degrees and approximately −90 degrees. The second subrange S2 of the range of tilt angles can be between approximately 30 degrees and approximately 50 degrees. The third subrange S3 of the range of tilt angles can be between approximately 50 degrees and approximately 90 degrees. In the first subrange S1 of tilt angles, the center of gravity CG of the monitor can be positioned at a first distance from the tilt axis TAR, creating a monitor torque MT in a first direction. The tilt mechanism can generate a spring torque ST to counteract such a monitor torque MT, as shown in FIG. 2A. In the second subrange S2 of tilt angles, the line of action of the monitor weight LW can be in line with the tilt axis TAR, resulting in an approximately zero monitor torque which can be balanced by friction within the system as depicted in FIG. 2B. In the third range S3 of subangles, the center of gravity CG of the monitor can be positioned at a second distance from the tilt axis TAR, resulting in a monitor torque MT in a second direction. The tilt mechanism can generate a spring torque ST to counteract such a monitor torque MT, as shown in FIG. 2C. The first and second directions of the monitor torque MT can be opposite. In some embodiments, the first direction can be a generally clockwise direction, and the second direction can be a generally counterclockwise direction. The tilt mechanism 10 can be adapted to provide a spring torque ST to balance the monitor torque MT due to the weight of the monitor.

FIGS. 3A-3B illustrate an exemplary embodiment of a tilt mechanism 10. The tilt mechanism 10 can be functionally coupled to the mounting structure 30, a tilt bracket 50 tiltable relative to the mounting structure and include a tilt axle 60 coincident with the tilt axis and supported by the mounting structure 30, and a torsion spring 70. In some embodiments, the monitor 20 can be supported by a monitor bracket (e.g., a VESA compliant bracket) 80 connectable to the tilt bracket 50. The tilt axle 60 can remain stationary relative to the tilt bracket 50 during a tilt angle adjustment. The tilt axle 60 can be fixedly attached to a mounting structure 30 such as an arm, a stand or cart. The torsion spring 70 can be positioned about the tilt axle.

The tilt bracket 50 can be tiltable about the tilt axis of rotation TAR across the range of tilt angles. The tilt bracket 50 can have a first spring engagement member 52 and a second spring engagement member 56. In some embodiments, the first spring engagement member includes a first tab 54A and a second tab 54B, optionally associated with an adjustment block 90 as described further below. The second spring engagement member 56 can include a third tab. The first and second spring engagement members of the tilt bracket 50 can be spaced apart by a distance. The tilt mechanism 10 can include a mandrel 58 positioned between the torsion spring 70 and the tilt axle.

The torsion spring 70 provides the spring torque ST to balance the monitor torque MT. In an exemplary embodiment, the monitor torque MT can act in a counterclockwise or a clockwise direction. The direction of the monitor torque MT depends on the position of the monitor center of gravity CG. Accordingly, in such an embodiment, the torsion spring 70 can be adapted to provide a spring torque ST to balance the monitor torque MT in either direction. In some embodiments, the torsion spring 70 can have a first spring leg 72 and a second spring leg 74, each extending from the tilt axle. The first spring leg 72 extends from the tilt axle 60 at a first length and the second spring leg 74 extends from the tilt axle 60 at a second length, which may be equal to or different from the first length. The torsion spring 70 can be adapted to provide a spring torque ST when one of the first and second spring engagement members of the tilt bracket 50 acts on one of the first and second spring legs. The direction of the spring torque ST can change within the range of tilt angles depending on which of the spring engagement members is engaged or disengaged with the spring legs.

In some embodiments, in the first subrange of the range of tilt angles the first spring engagement member 52 does not contact the first spring leg 72 and does contact the second spring leg 74, while the second spring engagement member 56 does not contact either the first spring leg 72 or the second spring leg 74. In such embodiments the first spring engagement member 52 does not contact the first spring leg 72 or the second spring leg 74, and the second spring engagement member 56 does not contact the first spring leg 72 or the second spring leg 74, in the second subrange of the range of tilt angles. Further in such embodiments, the first spring engagement member 52 does not contact the first spring leg 72 or the second spring leg 74, and the second spring engagement member 56 does contact the first spring leg 72 but not the second spring leg 74, in the third subrange of the range of tilt angles. Such relative positioning of the first and second spring engagement members 52, 56 with respect to the first and second legs 72, 74, can facilitate generating spring torques in different directions that can balance monitor torques when the monitor 20 is tilted with a range of tilt angles.

The spring torque ST acts in a first direction in the firrst subrange of the range of tilt angles and in a second direction in the third subrange of the range of tilt angles, the first direction being opposite to the second direction. The spring torque ST approximately equals zero in the second subrange of the range of tilt angles. The first spring engagement member 52 exerts a first force against the second spring leg 74 when the monitor torque MT is in a first direction. The second spring engagement member 56 exerts a second force against the first spring leg 72 when the monitor torque MT is in a second direction. The second direction can be opposite from the first direction.

As shown in FIGS. 4A-4B, the tilt mechanism 10 can include a first bracket 92 fixed with respect to the tilt axle 60 and a second bracket 94 fixed with respect to the tilt axle. In certain embodiments, the first bracket 92 contacts the first spring leg 72 and does not contact the second spring leg, and the second bracket 94 does not contact the first or second spring legs 72, 74, in the first subrange of the range of tilt angles. In such embodiments, the first bracket 92 contacts the first spring leg 72 and not the second spring leg 74, and the second bracket 94 contacts the second spring leg 74 and not the first spring leg 72, in the second subrange of the range of tilt angles. Further in such embodiments, the first bracket 92 does not contact the first spring leg 72 or the second spring leg 74, and the second bracket 94 contacts the second spring leg 74 and not the first spring leg 72, in the third subrange of the range of tilt angles. The first bracket 92 and the second bracket 94 can be connected to the mandrel 58 of the tilt mechanism. The mandrel 58 can additionally support the torsion spring. The first and second brackets 92, 94 can be useful for setting the position of the torsion spring 70 when the monitor torque MT is approximately zero and otherwise constrain the legs when they are not in contact with a spring engagement member. In an exemplary embodiment, the position and angle between the first and second brackets 92, 94 can be adjusted to set an initial spring torque ST in the torsion spring 70.

Figure 5:
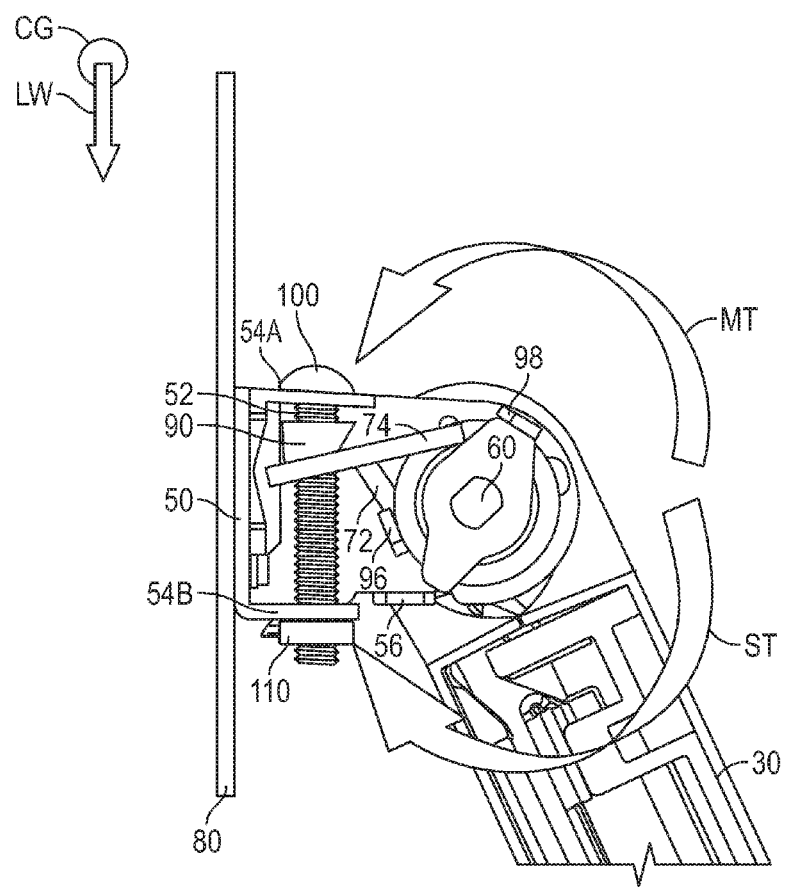
FIG. 5 is a side plan view of a tilt mechanism according to an embodiment of the invention with a tilt angle in a first subrange of a range of tilt angles.

In a first exemplary subrange of tilt angles as shown in FIG. 5, the spring torque ST can be in a first direction. The tilt angle is approximately in the first subrange S1 of the range of tilt angles, between approximately 30 degrees and approximately −90 degrees (e.g., approximately 30 degrees and approximately −15 degrees). The location of the monitor center of gravity CG is as shown in FIG. 5 (the monitor is not shown in FIG. 5). In this configuration the monitor torque MT is in a second direction. The first and second directions can be opposite, such that the spring torque ST balances the monitor torque MT. The first spring engagement member 52 can exert a second force on the second spring leg 74, resulting in the spring torque ST being in the first direction. The first spring leg 72 can generally be in contact with the first edge 96 of the first bracket. The first spring leg 72 may not contact the tilt bracket 50, including the first or second spring engagement members. As seen in FIG. 5, the first direction of the spring torque ST can be a generally clockwise direction. The second direction of the monitor torque MT can be a generally counterclockwise direction.

Figure 6:
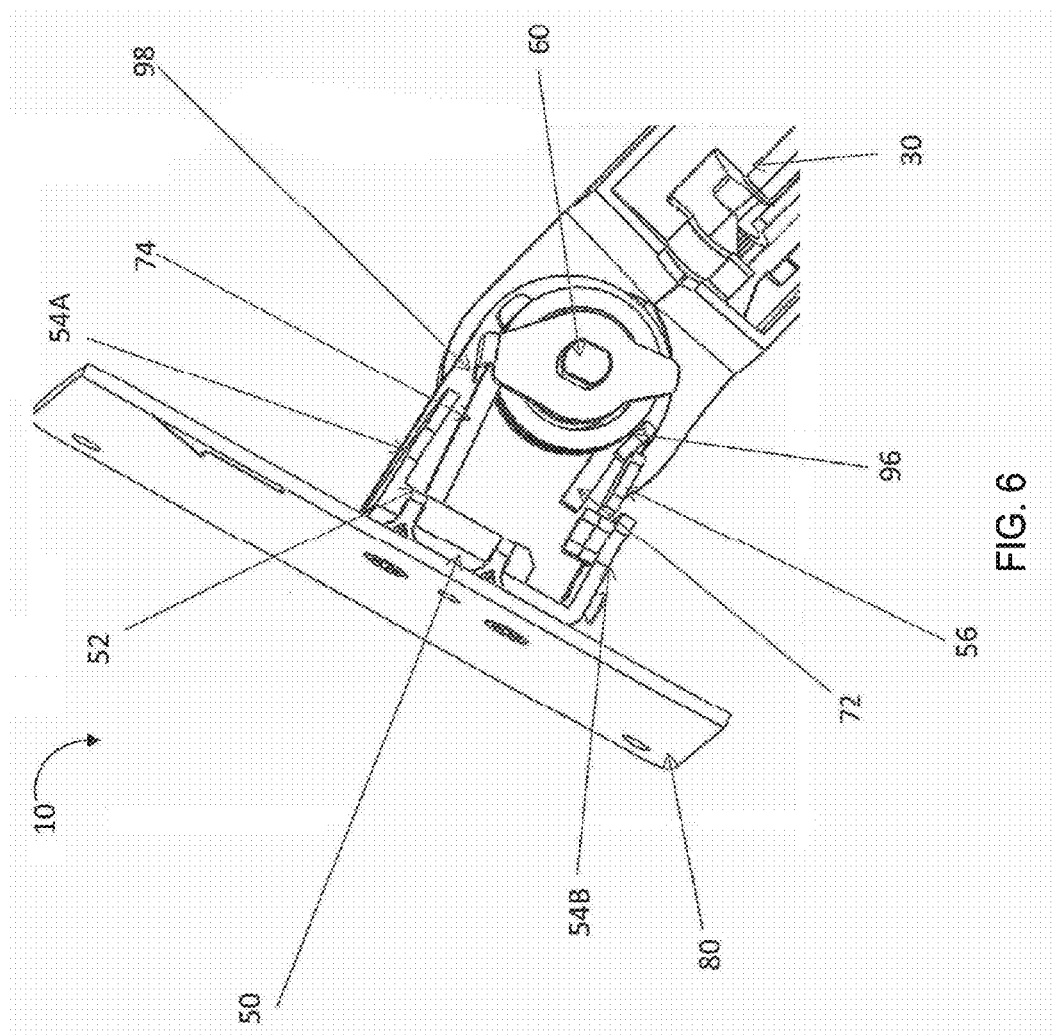
FIG. 6 is a side plan view of a tilt mechanism according to an embodiment of the invention with a tilt angle in a second subrange of a range of tilt angles.

In a second exemplary subrange of tilt angles, the monitor torque MT can be approximately zero. As shown in FIG. 6, the center of gravity of the monitor 20 can be positioned such that the monitor weight acts in line with the tilt axis of rotation. The tilt angle is approximately in the second subrange S2 of the range of tilt angles, between approximately 30 degrees and approximately 50 degrees. In such an embodiment, the first spring leg 72 is in contact with a first edge 96 of the first bracket 92 and the second spring leg 74 is in contact with a second edge 98 of the second bracket 94. The first spring leg 72 may not contact the tilt bracket 50, including the first or second spring engagement member. The second spring leg 74 may not contact the tilt bracket 50, including the first or second spring engagement members. The angle between the first and second spring legs 72, 74 of the torsion spring 70, and the angle between the first edge 96 of the first bracket 92 and second edge 98 of the second bracket 94 when assembled on the tilt axle 60 can be such that an initial tension is allowed on torsion spring 70 at when the monitor torque MT is approximately zero. The spring torque ST is approximately zero in this exemplary embodiment.

Figure 7:
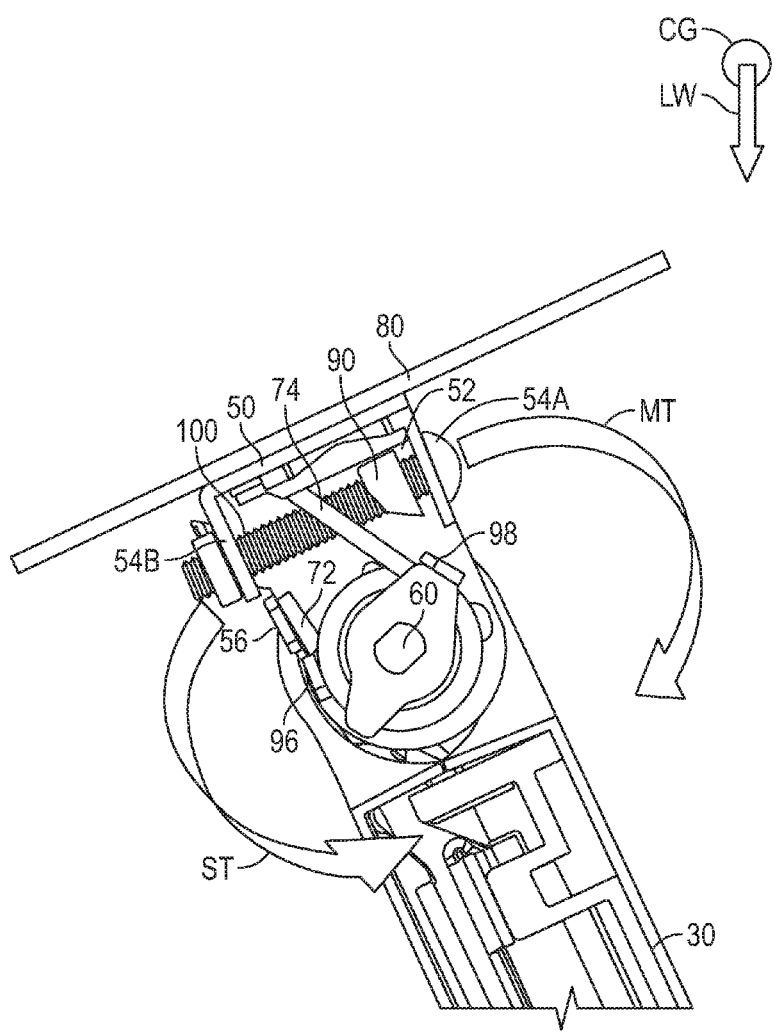
FIG. 7 is a side plan view of a tilt mechanism according to an embodiment of the invention with a tilt angle in a third subrange of a range of tilt angles.

In a third exemplary subrange of tilt angles as shown in FIG. 7, the spring torque ST can be in a second direction. The tilt angle is approximately in the third subrange S3 of the range of tilt angles, between approximately 50 degrees and approximately 90 degrees. The location of the monitor center of gravity CG is as shown in FIG. 7. In this configuration the monitor torque MT is in a first direction. The first and second directions can be opposite, such that the spring torque ST balances the monitor torque MT. The second spring engagement member 56 can exert a first force on the first spring leg 72, resulting in the spring torque ST being in the second direction. The second spring leg 74 can generally be in contact with the second edge 98 of the second bracket 94. The second spring leg 74 may not contact the tilt bracket 50, including the first or second spring engagement members. As seen in FIG. 7, the first direction of the monitor torque MT can be a generally clockwise direction. The second direction of the spring torque ST can be a generally counterclockwise direction.

In some embodiments, the first spring engagement member 52 can include an adjustment block. Such an adjustment block 90 can be useful for adjusting the position of engagement between the first spring engagement member and the spring within the range of tilt angles depending on the weight and configuration of the display. As shown, an adjustment screw 100 can movably connect the adjustment block 90 to the first and second tabs 54A, B of the tilt bracket 50, as best seen in FIGS. 5 and 7. The adjustment block 90 can threadingly engage with the adjustment screw 100. In some embodiments, the adjustment screw 100 is rotatingly coupled with the first and second tabs of the tilt bracket. In such an embodiment, a nut 110 positioned under the second tab 54 can be adapted to prevent axial movement of the adjustment screw. The nut 110 can threadingly engage with the adjustment screw.

Embodiments of the invention also include methods of using any of the tilt mechanism described herein. Methods in accordance with embodiments of the invention can include one or more of the following steps: providing an electronic display with a tilt mechanism; adjusting the tilt angle of the electronic display, thereby generating a monitor torque; pressing on a leg of a torsion spring of the spring mechanism, thereby generating a spring torque in a first direction that balances the monitor torque over a range of tilt angles; and pressing on a leg of a torsion spring of the spring mechanism, thereby generating a spring torque in a second direction opposite from the first direction that balances the monitor torque over a range of tilt angles.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention.

What is claimed is:

1. A tilt mechanism for an electronic display, comprising:
   a mounting structure;
   a tilt bracket tiltable relative to the mounting structure about a tilt axis of rotation across a range of tilt angles, the tilt bracket having a first spring engagement member and a second spring engagement member, the first and second spring engagement members spaced apart;
   a torsion spring positioned about a tilt axis, the torsion spring having a first spring leg and a second spring leg each extending from the tilt axis; and
   the torsion spring adapted to provide a spring torque when one of the first and second spring engagement members acts on one of the first and second spring legs, the spring torque acting against a monitor torque created by a monitor operably coupled to the tilt bracket, wherein the direction of the spring torque changes within the range of tilt angles,
   wherein the first spring engagement member does not contact the first spring leg and does contact the second spring leg in a first subrange of the range of tilt angles, the first spring engagement member and the second spring engagement member do not contact the first spring leg or the second spring leg in a second subrange of the range of tilt angles, and the second spring engagement member does contact the first spring leg and does not contact the second spring leg in a third subrange of the range of tilt angles.

2. The tilt mechanism of claim 1, further including a tilt axle supported by the mounting structure, the tilt axle remaining stationary relative to the tilt bracket during a tilt angle adjustment and a first bracket fixed with respect to the tilt axle and a second bracket fixed with respect to the tilt axle, wherein the first bracket contacts the first spring leg in the first subrange of the range of tilt angles, the first bracket contacts the first spring leg and the second bracket contacts the second spring leg in the second subrange of the range of tilt angles, and the second bracket contacts the second spring leg in the third subrange of the range of tilt angles.

3. The tilt mechanism of claim 2, further including a mandrel positioned between the torsion spring and the tilt axle, the mandrel connected to the first bracket and the second bracket.

4. The tilt mechanism of claim 1, wherein the spring torque acts in a first direction in the first subrange of the range of tilt angles and in a second direction in the third subrange of the range of tilt angles, the first direction being opposite to the second direction.

5. The tilt mechanism of claim 1, wherein in the second subrange of the range of tilt angles the spring torque approximately equals zero.

6. The tilt mechanism of claim 5, wherein the second spring engagement member exerts a second force against the first spring leg when the monitor torque is in a second direction, the second direction being opposite from the first direction.

7. The tilt mechanism of claim 1, wherein the first spring engagement member exerts a first force against the second spring leg when the monitor torque is in a first direction.

8. The tilt mechanism of claim 1, further comprising an adjustment block associated with a first and second tab of the first spring engagement member.

9. The tilt mechanism of claim 8, wherein the first tab acts on the first spring leg in a direction substantially perpendicular to the tilt axis.

10. The tilt mechanism of claim 8, wherein the second tab acts on the second spring leg in a direction substantially perpendicular to the tilt axis.

11. The tilt mechanism of claim 1, wherein the second spring engagement member includes a tab.

12. The tilt mechanism of claim 1, wherein the range of tilt angles is approximately −90 degrees to approximately 90 degrees.

13. The tilt mechanism of claim 1, wherein the first subrange of the range of tilt angles is between approximately 30 degrees and approximately −90 degrees.

14. The tilt mechanism of claim 1, wherein the second subrange of the range of tilt angles is between approximately 30 degrees and approximately 50 degrees.

15. The tilt mechanism of claim 1, wherein the third subrange of the range of tilt angles is between approximately 50 degrees and approximately 90 degrees.

16. The tilt mechanism of claim 1, further comprising a monitor bracket connected to the tilt bracket, the monitor bracket adapted to connect to a monitor.

17. The tilt mechanism of claim 1, wherein the first spring leg extends from the tilt axis at a first length and the second spring leg extends from the tilt axis at a second length.

* * * * *